(12) United States Patent
Imai et al.

(10) Patent No.: US 6,477,766 B2
(45) Date of Patent: Nov. 12, 2002

(54) AXIAL-TYPE ELECTRONIC COMPONENT INSERTING APPARATUS

(75) Inventors: Kiyoshi Imai, Kofu (JP); Hideaki Watanabe, Kofu (JP); Hiromi Kinoshita, Singapore (SG); Dai Yokoyama, Kofu (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/772,929

(22) Filed: Jan. 31, 2001

(65) Prior Publication Data

US 2001/0003864 A1 Jun. 21, 2001

Related U.S. Application Data

(62) Division of application No. 08/932,962, filed on Sep. 18, 1997, now Pat. No. 6,205,655, which is a division of application No. 08/740,993, filed on Nov. 5, 1996, now Pat. No. 5,701,662.

(30) Foreign Application Priority Data

Nov. 6, 1995 (JP) .............................................. 7-287443

(51) Int. Cl.[7] ................................................ B23P 19/00
(52) U.S. Cl. ...................... 29/741; 29/564.6; 29/564.2; 29/845; 29/838; 29/837; 901/40
(58) Field of Search ....................... 29/741, 740, 564.6, 29/566.2, 739, 738, 834, 837, 838; 901/40, 39

(56) References Cited

U.S. PATENT DOCUMENTS

| | | |
|---|---|---|
| 4,051,593 A | 10/1977 | Mori et al. |
| 4,287,668 A | 9/1981 | Arai et al. |
| 4,479,673 A * | 10/1984 | Inaba et al. .................. 294/88 |
| 4,680,841 A | 7/1987 | Schneider et al. |
| 4,750,263 A | 6/1988 | Yagi et al. |
| 4,763,400 A | 8/1988 | Deckers |
| 4,797,996 A * | 1/1989 | Lobry et al. .................. 29/740 |
| 4,987,676 A * | 1/1991 | Amorosi ....................... 29/740 |
| 5,210,933 A | 5/1993 | Miyanishi et al. |
| 5,832,597 A * | 11/1998 | Ykoyama et al. ............. 29/837 |
| 5,864,945 A * | 2/1999 | Imai et al. .................... 29/838 |

FOREIGN PATENT DOCUMENTS

| | | | |
|---|---|---|---|
| EP | 0041041 A1 | 12/1981 | |
| GB | 2277072 A | 10/1994 | |
| JP | 1-305600 | 2/1988 | |
| JP | 63-52935 | 3/1988 | |
| JP | 01013799 | * 1/1989 | .................. 29/739 |
| SU | 1559450 | 4/1990 | |

* cited by examiner

Primary Examiner—Carl J. Arbes
Assistant Examiner—Minh Trinh
(74) Attorney, Agent, or Firm—Wenderoth, Lind & Ponack, L.L.P.

(57) ABSTRACT

An axial type electronic component inserting apparatus is provided for inserting into holes of a board a pair of lead wires of each of axial type electronic components connected by a tape at regular intervals. A first kind of the components have a larger tape interval and a second kind of the components have a smaller tape interval. The apparatus includes a pair of centering chucks having recesses for contacting both sides of the body of the component, and being movable in a symmetrical manner with respect to the center to adjust the body of the component from both sides of the main body while the recesses come in contact with both sides of the body of the component, thus resulting in centering of the component.

10 Claims, 11 Drawing Sheets

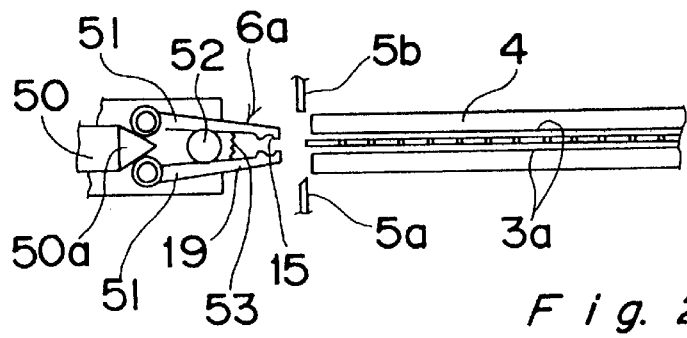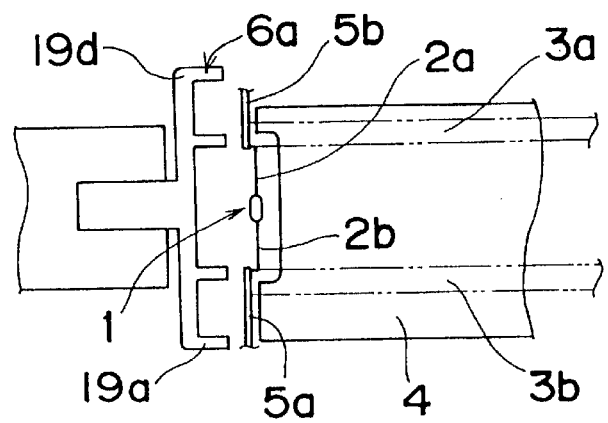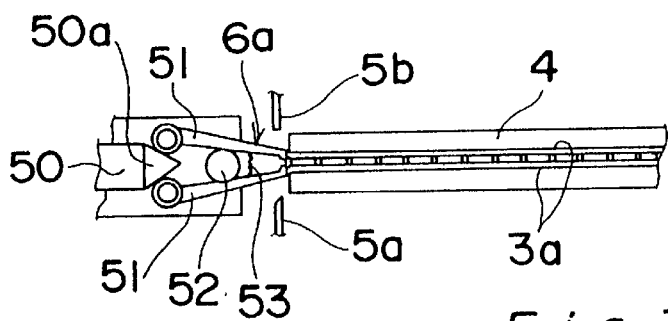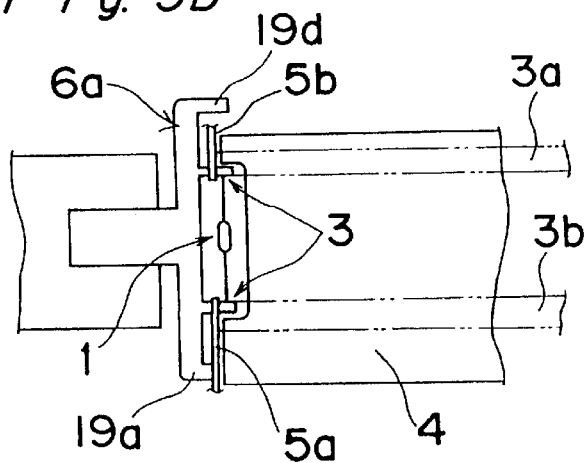

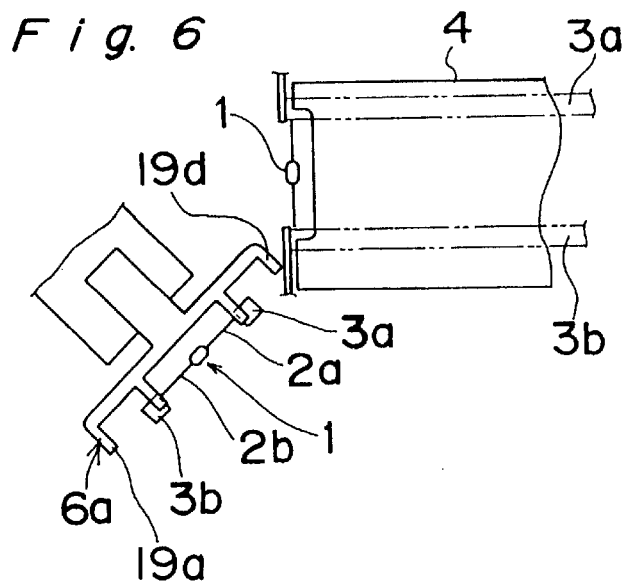
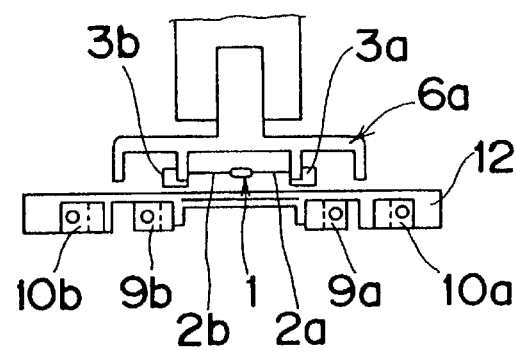
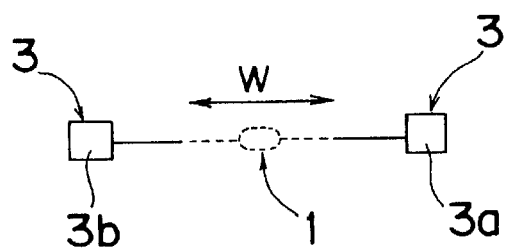
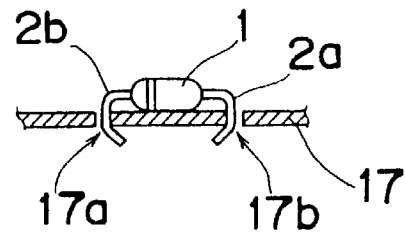

AXIAL-TYPE ELECTRONIC COMPONENT INSERTING APPARATUS

This is a divisional application of Ser. No. 08/932,962, filed Sep. 18, 1997 which is U.S. Pat. No. 6,205,655, which is a divisional application of Ser. No. 08/740,993 filed Nov. 5, 1996, now U.S. Pat. No. 5,701,662.

BACKGROUND OF THE INVENTION

The present invention relates to an axial type electronic component inserting method and apparatus for automatically inserting lead wires of an axial type electronic component into specified holes of a board.

As shown in FIG. 11A, axial type electronic components are assembled with their pairs of lead wires 2a and 2b extending from electronic component bodies 1a arranged at regular intervals of d1 as taped at both ends of the lead wires 2a and 2b by tapes 3a and 3b. It is known that such an assembly of axial type electronic components 1 taped at regular intervals as described above is subjected to an inserting process by an apparatus as disclosed in Japanese Patent Laid-Open Publication No. 1-305600 and so forth.

A component supplier 4 as shown in FIG. 12 retains such an assembly of axial type electronic components 1, and it is provided with cutters 5a and 5b for cutting the tapes 3a and 3b that are taping the lead wires 2a and 2b of the axial type electronic components 1.

Taped end portions including the lead wires of the assembly of the axial type electronic components 1 retained by the component supplier 4 are grasped and pulled by chuck pieces 6 of a component carrier 7, and the tapes 3a and 3b are cut by the cutters 5a and 5b of the component supplier 4, so that one axial type electronic component 1 is taken out.

The axial type electronic component 1 that has been taken out is grasped by the chuck pieces 6 by their end portions, and then carried by the component carrier 7 to an inserting position.

A component inserter 11 as shown in FIG. 13 receives the axial type electronic component 1 from the component carrier 7 in the inserting position, cuts both the ends of the lead wires 2a and 2b including the lead taping portions of the axial type electronic component 1, bends the extending lead wires 2a and 2b at both the ends to a desired width, and inserts the extreme end portions of the lead wires into specified holes of a board.

In the prior art shown in FIGS. 12 and 13, component inserting processes have been successively performed by reciprocating one component carrier 7 between the component supplier 4 that retains the axial type electronic components 1 and the component inserter 11 that inserts each axial type electronic component 1.

Furthermore, according to the Japanese Patent Laid-Open Publication No. 1-305600, its component carrier is constructed so that it can mount another chuck piece for grasping even a radial type electronic component in addition to the axial type electronic component.

According to the above-mentioned conventional construction, it has been very difficult to reduce the insertion cycle because the axial type electronic component supplying and inserting operations are executed alternately one after another. In other words, since the axial type electronic components are fetched or taken out one by one, there is a process in which the component carrier returns as unloaded. This has occupied a great part of the component insertion cycle time, and has been problematic lately when mass production is required in a short time.

Furthermore, in the case of a component grasping device for grasping even a radial type electronic component in addition to the axial type electronic component as disclosed in the Japanese Patent Laid-Open Publication No. 1-305600, there is the issue that the device cannot manage axial type electronic components having different tape intervals (taping intervals) (e.g., a tape interval of 26 mm and a tape interval of 52 mm as indicated by d2 in FIG. 11A).

SUMMARY OF THE INVENTION

Accordingly, an object of the present invention is to provide an axial type electronic component inserting method and apparatus capable of improving an axial type electronic component inserting efficiency and managing axial type electronic components having different tape interval specifications.

In accomplishing these and other aspects, according to one aspect of the present invention, there is provided an axial type electronic component inserting method for inserting into specified holes of a board a pair of lead wires of each of axial type electronic components while a plurality of chucks grasping each of the axial type electronic components are intermittently moved to a component supplying position and a component transferring position, respectively, the pair of lead wires extending from a main body of each the electronic components belonging to an assembly of electronic components which are connected by a tape as arranged at regular intervals, each of the chucks comprising protruding grasping pieces having first grasping grooves and second grasping grooves, the first grasping grooves grasping, with their inner surfaces, end portions of each of the first kind of the axial type electronic components whose taped portions are of a larger tape interval, the second grasping grooves grasping, with their inner surfaces, end portions of each of the second kind of the axial type electronic components whose taped portions are of a smaller tape interval than the larger tape interval, a depth of each of the first grasping grooves being slightly smaller than a depth of each of the second grasping grooves.

The method comprises:
  a first process for
    taking out one of the axial type electronic components from a component supplying device for retaining the assembly of axial type electronic components connected by the tape while one of the chucks grasps end portions of the assembly at the component supplying position while preventing the second grasping grooves from contacting the lead wires of each of the first kind of the axial type electronic components grasped by the first grasping grooves when each of the first kind of the axial type electronic components are grasped by the chuck; and
  a component delivering process for
    moving to a component inserting device the chuck which has already grasped the axial type electronic component through the first process, and
    delivering the axial type electronic component to the component inserting device from the chuck,
  wherein the first process and the component delivering process are simultaneously executed.

According to a second aspect of the present invention, there is provided the axial type electronic component inserting method as defined in the first aspect, wherein the first process includes, before the component taking-out step, a step of stopping one of the chucks at the component supplying position and a step of grasping by the stopped chuck the end portions of the assembly of axial type electronic components in the component supplying device for retaining the assembly of axial type electronic components connected by the tape, and also includes, after the taking-out step, a step of cutting the tape which connects the assembly of axial type electronic components so as to separate each axial type electronic component.

According to a third aspect of the present invention, there is provided the axial type electronic component inserting method as defined in the second aspect, wherein the component delivering process includes:

a second process for
moving to the component transferring position the chuck which has already grasped the axial type electronic component in the first process, and
delivering the grasped axial type electronic component to a component transferring device; and a third process for:
delivering the axial type electronic component to the component inserting device from the component transferring device which has already grasped the axial type electronic component through the second process.

According to a fourth aspect of the present invention, there is provided the axial type electronic component inserting method as defined in the third aspect, further comprising:

a fourth process for:
inserting both ends of the lead wires or the component which has already been received by the component inserting device into the specified holes of the board, and
bending the lead wires underneath the board to fix the lead wires to the board,
wherein the third process is completed by a time when the chuck located in the component transferring position is put into a state in which the chuck becomes capable of delivering the axial type electronic component to the component transferring device in the second process of a subsequent component inserting cycle, and
the fourth process is completed by a time when the component transferring device is put into a state in which the component transferring device becomes capable of delivering the axial type electronic component to the component inserting device in the third process of the subsequent component inserting cycle.

According to a fifth aspect of the present invention, there is provided the axial type electronic component inserting method as defined in the fourth aspect, further comprising:

a fifth process for:
intermittently moving the chucks to the component supplying position and the component transferring position, respectively, by a carrying device; and a sixth process for:
stopping the chucks at the component supplying position and the component transferring position by the carrying device,
wherein the fifth process and the sixth process are executed alternately, and
the first process is executed in the sixth process concurrently with execution of the second process.

According to a sixth aspect of the present invention, there is provided the axial type electronic component inserting method as defined in the third aspect, wherein in the third process, the component transferring device centers the axial type electronic component by adjusting the main body of the axial type electronic component from both sides of the main body while recesses formed on facing portions of centering pieces come in contact with both sides of the body of the electronic component.

According to a seventh aspect of the present invention, there is provided the axial type electronic component inserting method as defined in the fourth aspect, wherein in the third process, the component transferring device centers the axial type electronic component by adjusting the main body of the axial type electronic component from both sides of the main body while recesses formed on facing portions of centering pieces come in contact with both sides of the body of the electronic component.

According to an eighth aspect of the present invention, there is provided the axial type electronic component inserting method as defined in the fifth aspect, wherein in the third process, the component transferring device centers the axial type electronic component by adjusting the main body of the axial type electronic component from both sides of the main body while recesses formed on facing portions of centering pieces come in contact with both sides of the body of the electronic component.

According to a ninth aspect of the present invention, there is provided an axial type electronic component inserting apparatus for inserting into specified holes of aboard a pair of lead wires of each of axial type electronic components, the pair of lead wires extending from the main body of each of the electronic components belonging to an assembly of electronic components which are connected by a tape as arranged at regular intervals, each of taped portions of a first kind of the axial type electronic components having a larger tape interval and each of taped portions of a second kind of the axial type electronic components having a smaller tape interval than the larger tape interval. the apparatus comprising:

chucks constructed so that each of the chucks can move forward and backward while grasping end portions of one of the first and second kinds of the axial type electronic components, each of the chucks comprising protruding grasping pieces having first grasping grooves and second grasping grooves, the first grasping grooves grasping, with their inner surfaces, end portions of each of the first kind of the axial type electronic components, the second grasping grooves grasping, with their inner surfaces, end portions of each of the second kind of the axial type electronic components, a depth of each of the first grasping grooves being slightly smaller than a depth of each of the second grasping grooves so as to prevent the second grasping grooves from contacting the lead wires of each of the first kind of the axial type electronic components grasped by the first grasping grooves;

a component carrying device which is provided with the chucks arranged at regular intervals in a circular form and each of which operates intermittently so that each chuck stops at least in a component supplying position and a component transferring position;

a component supplying device which is provided with a cutter for cutting the tape connecting the assembly of axial type electronic components and operates to supply each axial type electronic component to each chuck located in the component supplying position; and a component transferring and inserting device which receives the axial type electronic component from each chuck located in the component transferring position, inserts both the ends of the lead wires into the specified holes of the board, and bends the lead wires underneath the board so as to fix the axial type electronic component to the board.

According to a tenth aspect of the present invention, there is provided the axial type electronic component inserting apparatus as defined in the ninth aspect, wherein the component transferring and inserting device comprises:

a component transferring device which receives each axial type electronic component from each chuck located in the component transferring position and transfers the axial type electronic component to a component inserting position; and a component inserting device which receives the axial type electronic component from the component transferring device in the component inserting position, inserts both the ends of the lead wires into the specified holes of the board, and bends the lead wires underneath the board so as to fix the axial type electronic component to the board.

According to an eleventh aspect of the present invention, there is provided the axial type electronic component inserting apparatus as defined in the tenth aspect, wherein each of the chucks has a plurality of protruding grasping pieces corresponding to different tape intervals for concurrently grasping the tapes and lead wires of the axial type electronic component having different tape intervals, and the component transferring device is provided with retaining pieces corresponding to the protruding grasping pieces of the component grasping device.

According to a twelfth aspect of the present invention, there is provided the axial type electronic component inserting apparatus as defined in the tenth aspect, wherein the component transferring device is provided with centering pieces for centering the axial type electronic component by adjusting the main body of each set axial type electronic component from both sides of the main body while recesses formed on facing portions of centering pieces come in contact with both sides of the body of the electronic component.

According to a thirteenth aspect of the present invention, there is provided the axial type electronic component inserting apparatus as defined in the eleventh aspect, wherein the component transferring device is provided with centering pieces for centering the axial type electronic component by adjusting the main body of each set axial type electronic component from both sides of the main body while recesses formed on facing portions of centering pieces come in contact with both sides of the body of the electronic component.

According to a fourteenth aspect of the present invention, there is provided the axial type electronic component inserting apparatus as defined in the tenth aspect, wherein the component inserting device cuts both ends of the lead wires, and bends the extending lead wires to a desired width, before inserting both the ends of the lead wires into the specified holes of the board.

BRIEF DESCRIPTION OF THE DRAWINGS

These and other aspects and features of the present invention will become clear from the following description taken in conjunction with the preferred embodiments thereof with reference to the accompanying drawings, in which:

FIG. 2A is a side view of a chucking operation of a supplying device of the apparatus;

FIG. 2B is a top view of the chucking operation of the supplying device;

FIG. 3A is a side view of a chucking operation of the supplying device;

FIG. 3B is a top view of the chucking operation of the supplying device;

FIG. 6 is a top view of a turning operation of a carrying device of the apparatus;

FIG. 7 is a side view of transfer of an axial type electronic component in the apparatus;

FIG. 8 is a conceptual view of cutting of lead wires;

FIG. 9 is a sectional view of fixing of an axial type electronic component;

DETAILED DESCRIPTION OF THE PREFERRED EMBODIMENTS

Figure 1:
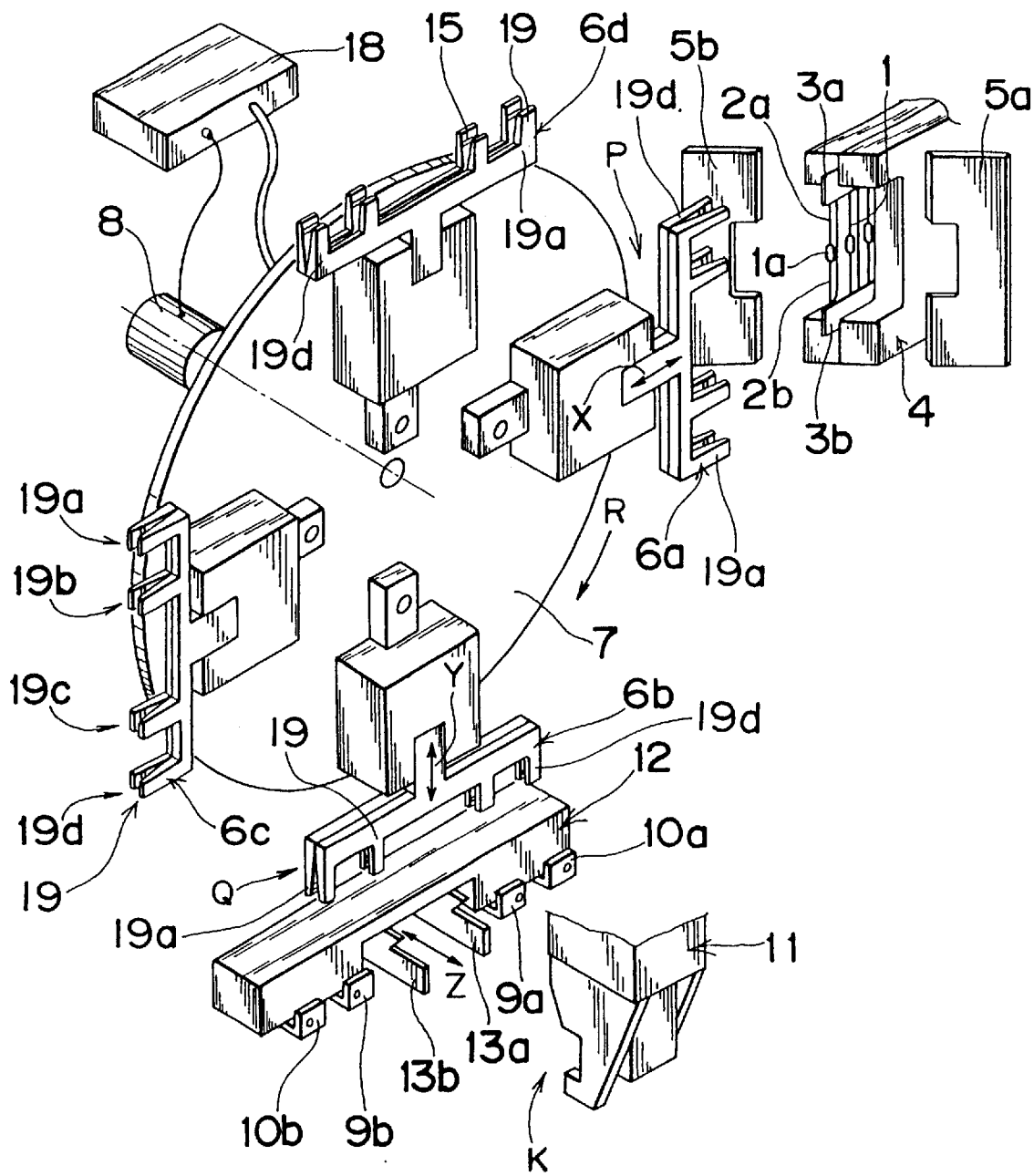
FIG. 1 is a schematic diagram showing an axial type electronic component inserting apparatus according to an embodiment of the present invention.

Before the description of the present invention proceeds, it is to be noted that like parts are designated by like reference numerals throughout the accompanying drawings.

Embodiments of the present invention will be described in detail below with reference to the accompanying drawings.

An axial type electronic component inserter of an embodiment of the present invention as shown in FIG. 1 comprises a supplying device 4 which stores an assembly of axial type electronic components having a tape interval of 26 mm as one example and includes cutters 5a and 5b for cutting tapes 3a and 3b that tape lead wires 2a and 2b of each axial type electronic component 1. The cutters 5a and 5b are driven by driving devices such as solenoids or cylinders under the control of a controller 18 described below.

Figure 4A:
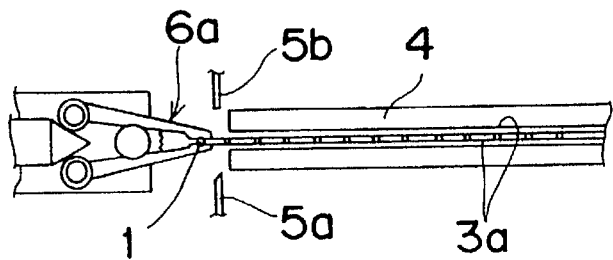
FIG. 4A is a side view of a chucking operation of the supplying device.
Figure 5A:
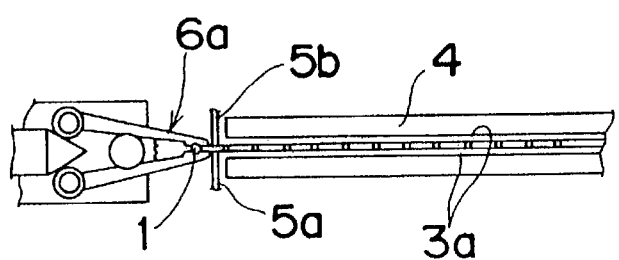
FIG. 5A is a side view of a chucking operation of the supplying device.

There is further comprised a circular table (component carrying device) 7 which is provided with four chucks 6a, 6b, 6c, and 6d that hold the taped portions including the lead wires of the axial type electronic component assembly stored in the supplying device 4 by protruding pieces 19 each having a grasping groove 15 and that take out axial type electronic components 1 at intervals of each component. The table 7 successively shifts the chucks 6a through 6d to specified station positions by intermittently turning in a direction of R. Each chuck has a pair of chucking elements 51 capable of reversibly rotating around a fulcrum 52 against an urging force of a compression spring 53 or by the urging force so as to hold the tape 3 with or release the tap 3 from the holding ends of the elements 51, and a wedge element 50 having at its tip end a wedge portion 50a capable of being inserted into or retracted from between the ends of the chucking elements 51 so as to rotate the elements 51 for holding the tape 3 with or releasing the tape 3 from the holding ends of the chucking elements 51. That is, when the tape 3 is held by the holding ends of the elements 51 as shown in FIGS. 2A, 3A, 4A, and 5A, the wedge portion 50a of the wedge element 50 is first retracted from between the other ends of the elements 51 to open the holding ends of the elements 51 by the urging force of the spring 53 and then, after the tape 3 is located between the opened holding ends of the elements 51, the wedge portion 50a is inserted between the other ends of the elements 51 such that the holding ends of the elements 51 are closed and the tape 3 is held therebetween against the urging force of the spring 53 as shown in FIGS. 3A, 4A, and 5A. On the other hand, when the tape 3 is released from the holding ends of the elements 51, the wedge portion 50a is retracted from the other ends of the elements 51 to open the holding ends of the elements 51.

A component inserting device 11 has a component transferring device 12 which receives each axial type electronic component 1 grasped by any of the chucks 6a through 6d provided on the circular table 7, cuts both ends of the lead wires 2a and 2b including the taped lead portions of each axial type electronic component 1 set on the transferring device 12, bends the lead wires 2a and 2b extending from the electronic component body 1 a to a specified width, and then inserts the lead wire ends of the axial type electronic component 1 into specified holes of a board. The respective concrete operations of the inserting device 11 are described in U.S. Pat. Nos. 5,832,597 and 5,797,178.

Further, the four chucks 6a through 6d on the circular table 7 are arranged so that two of them are simultaneously positioned in a component supplying station position P of the supplying device 4 and a component transferring station position Q of the transferring device 12 by an intermittent turning operation of an AC servomotor 8. The supplying device 4, the circular table 7, and the inserting device 11 are each controlled by a controller 18 which synchronously executes the supplying and inserting operations of the axial type electronic components 1. The operation of the transferring device 12 can be also controlled by the controller 18 so as to cooperate with the inserting device 11 and the circular table 7.

Figure 14:
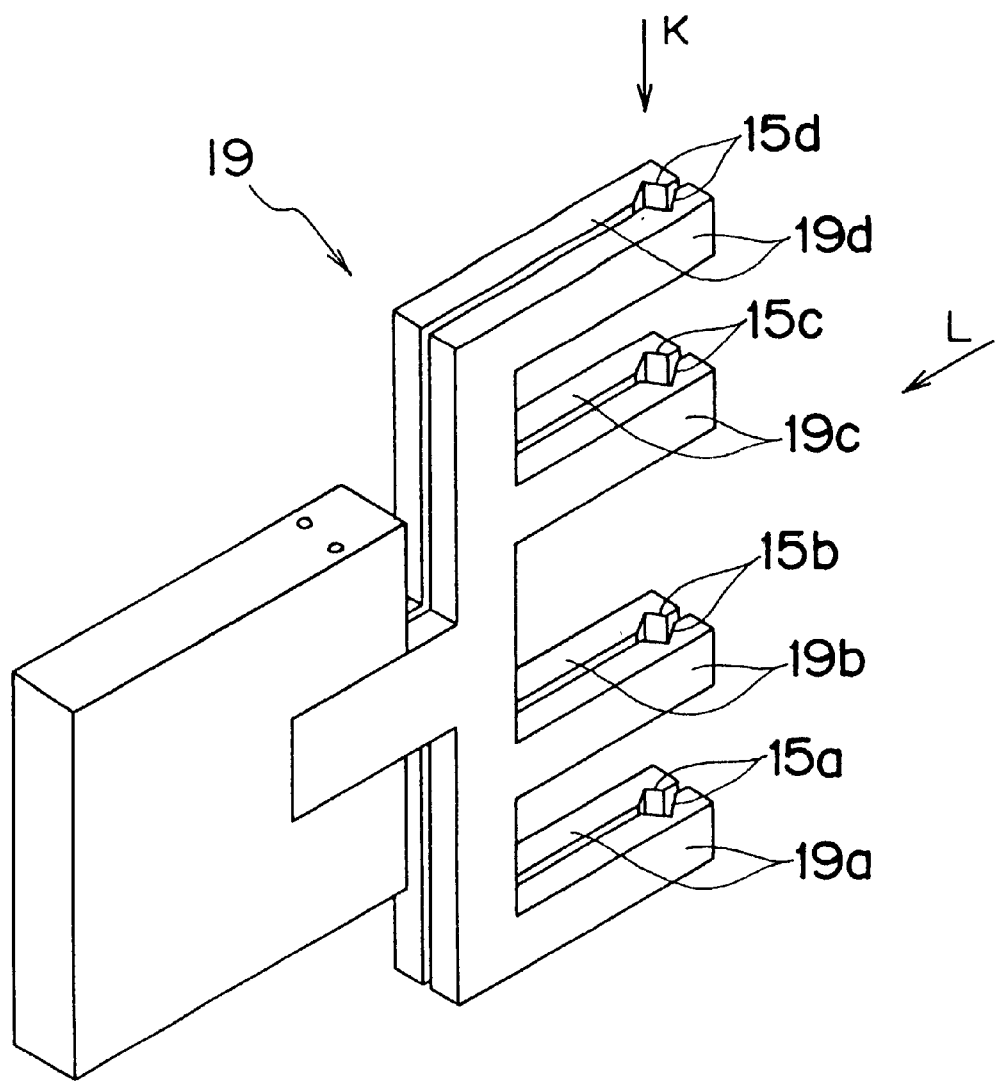
FIG. 14 is a fragmentary detail view of a portion of the arrangement shown in FIG. 1.
Figure 15A:
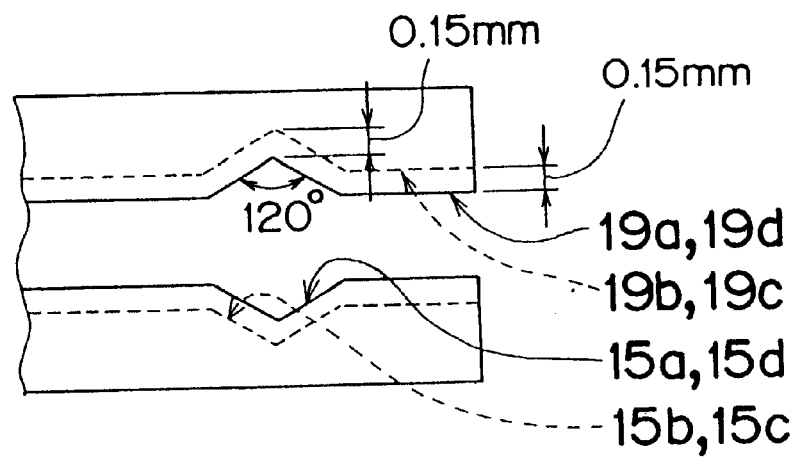
FIGS. 15A and 15B illustrate the FIG. 14 portion as viewed in the directions of arrows K and L respectively.
Figure 15B:
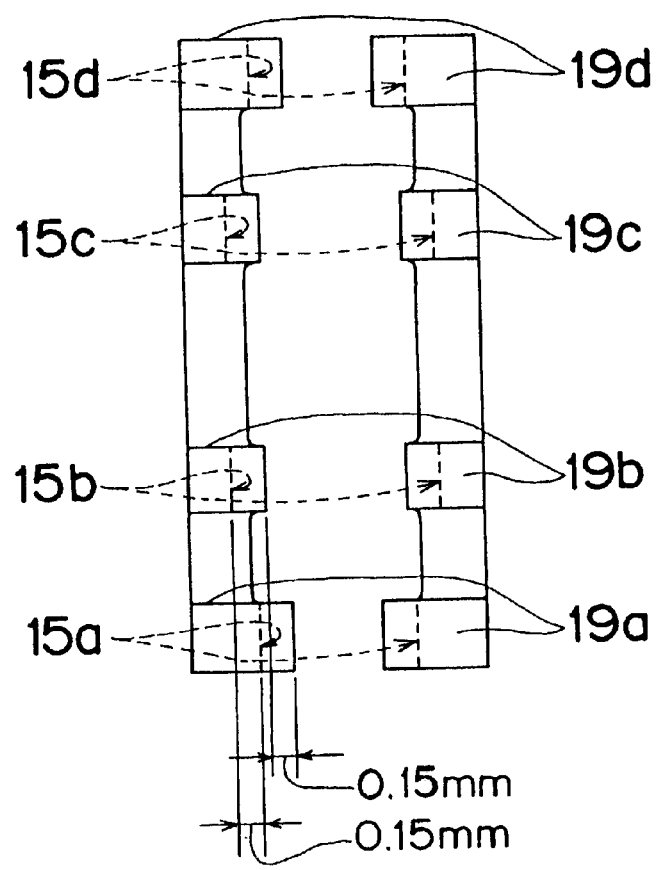

Each of the chucks 6a through 6d is provided with four protruding grasping pieces (component grasping device) 19a through 19d so that they can grasp an axial type electronic component 1 having a varied tape interval. For example, a pair of protruding grasping pieces 19a and 19d located outwardly are to grasp an axial type electronic component 1 having a tape interval of 52 mm, while a pair of protruding grasping pieces 19b and 19c located inwardly are to grasp an axial type electronic component 1 having a tape interval of 26 mm. As shown in FIGS. 14, 15A, and 15B, the outer side pair (for the electronic components with the tape interval of 52 mm) of protruding grasping pieces 19a, 19d have grasping grooves 15a, 15d which are less deep by 0.15 mm than grasping grooves 15b, 15c of the inner side pair (for the electronic components with the tape interval of 26 mm) of protruding grasping pieces 19b, 19c. These protruding grasping pieces 19a through 19d are constructed so that they cap grasp a component having either tape interval. Furthermore, the chucks 6a through 6d are constructed so that they can be advanced and retracted as indicated by arrows X and Y with respect to the position of the supplying device 4 and the position of the transferring device 12 in the component supplying station position P and the component transferring station position Q, respectively, by driving devices such as cylinders or solenoids under the control of the controller 18.

Figure 16A:
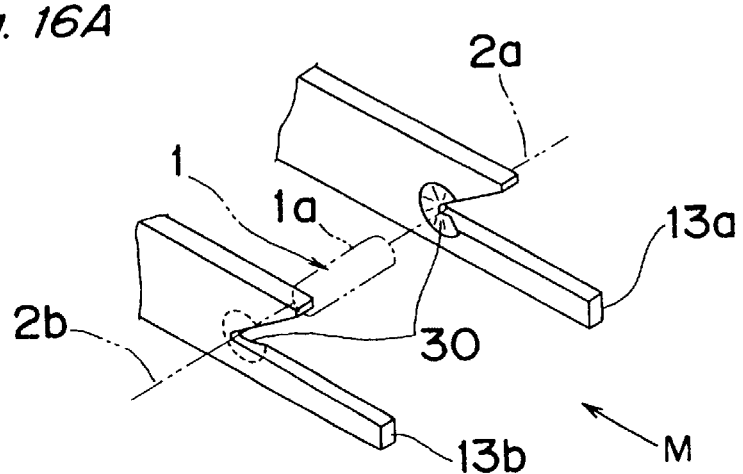
FIG. 16A and 16B are fragmentary detail view of a portion of the FIG. 1 arrangement, with FIG. 16B being a view of the centering chucks viewed in a direction of an arrow M in FIG. 16A.
Figure 16B:
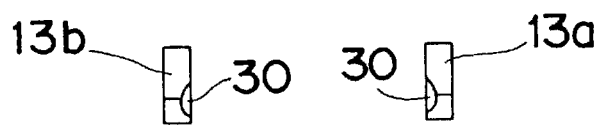

Further, the transferring device 12 is provided with a pair of centering chucks (centering pieces) 13a and 13b for centering the position of the main body of each set axial type electronic component 1. The centering chucks 13a, 13b have recesses 30 in their portions which are to contact opposite ends of the body 1a of each electronic component 1 as shown in FIGS. 16A and 16B. The pair of centering chucks 13a and 13b provided in center positions for holding each component adjust the axial type electronic component 1 from both the ends of the body 1a of the component 1 delivered to retaining pieces 9a and 9b or 10a and 10b provided at the transferring device 12 so as to correct the position of the component 1. That is, the centering chucks 13a and 13b are arranged and are movable in a symmetrical manner with respect to the center of the transferring device 12. Thus, if the component 1 is received by the centering chucks 13a and 13b and the retaining pieces 9a and 9b or 10a and 10b with the component 1 shifted from the center of the transferring device 12, the centering chucks 13a and 13b are simultaneously moved in directions to come closer to each other and one of the centering chucks 13a and 13b contacts and moves the component 1 toward the other chuck. Then, finally, the component 1 is held between the centering chucks 13a and 13b with the component centered with respect to the center of the transferring device 12. The pair of retaining pieces 10a and 10b located outwardly and the retaining pieces 9a and 9b located inwardly are arranged so that they correspond to the pair of protruding grasping pieces 19a and 19d located outwardly and the pair of protruding grasping pieces 19b and 19c located inwardly, and constructed so that they can advance and retreat in a direction as indicated by an arrow Z relative to the inserting device 11 while holding the axial type electronic component 1.

The principle of operation of the axial type electronic component inserting apparatus constructed as above will be described with reference to FIGS. 2A through 10.

The operation in a state in which the chuck 6a shown in FIG. 1 is stopped in the component supplying station position P and the chuck 6b is stopped in the component transferring station position Q (in the condition of process F) will be described below.

Figure 10:
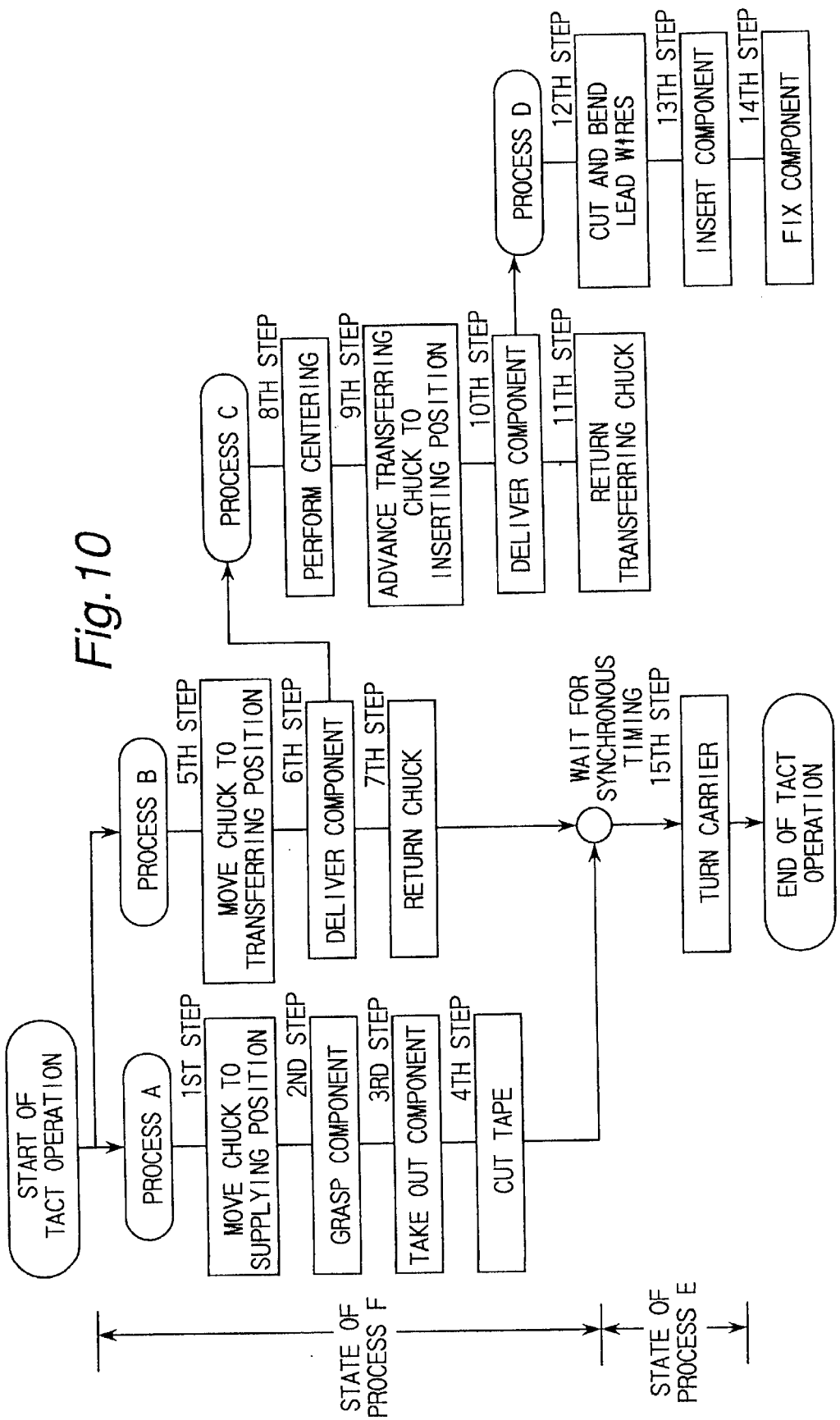
FIG. 10 is a flowchart of an operation example according to an axial type electronic component inserting method according to an embodiment of the present invention.

In the component supplying station position P, a component taking-out process (process A) is executed in 1st to 4th Steps in FIG. 10. That is, upon receiving a start command from the controller 18, the chuck 6a advances in the upper-right direction as indicated by the arrow X in FIG. 1 while opening the ends of the protruding pieces 19 having the grasping grooves 15 as shown in FIGS. 2A and 2B so as to grasp the lead wires 2a and 2b of the axial type electronic component 1 retained in the supplying device 4 including the portions taped by the tapes 3a and 3b which wrap the lead wires 2a and 2b (1st Step). After advancing to a specified position (a supplying position) at the supplying device 4, the chuck 6a grasps the taped portions 3 at both the ends of the axial type electronic component 1 (2nd Step).

Figure 4B:
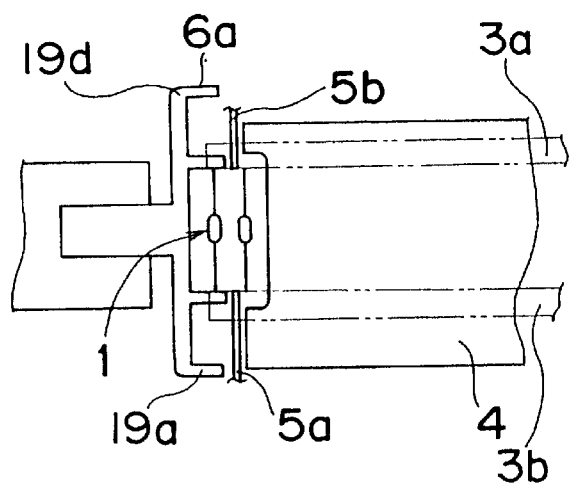
FIG. 4B is a top view of the chucking operation of the supplying device.

Then, the chuck 6a that is grasping the taped portions 3 at both the ends of the axial type electronic component 1 retreats while grasping the axial type electronic component 1, so that it takes out the axial type electronic component 1 as shown in FIGS. 4A and 4B by a specified pitch corresponding to the interval between the components 1 (3rd Step). At this time, for example, the supplying device 4 intermittently holds and releases the tapes 3 connected to the axial type electronic components 1 in accordance with the component taking-out operation.

Figure 5B:
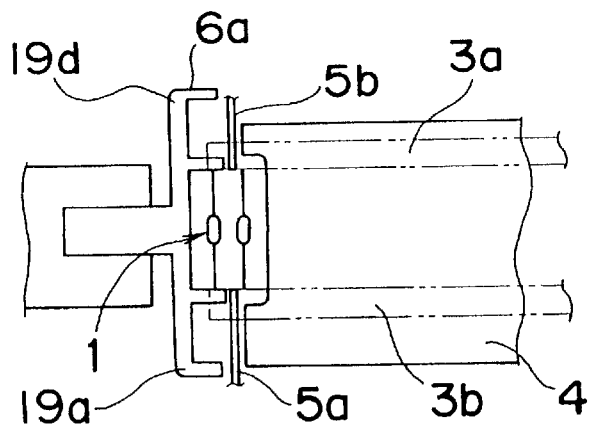
FIG. 5B is a top view of the chucking operation of the supplying device.
Figure 11A:
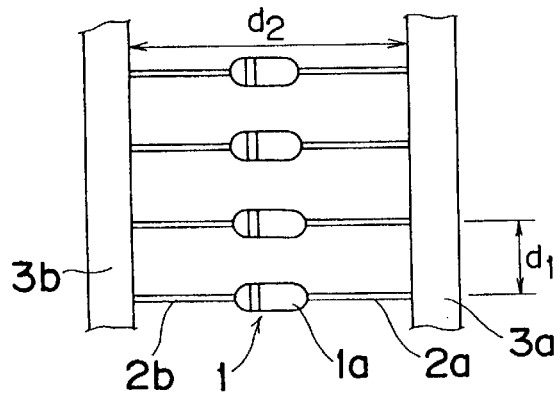
FIG. 11A is a schematic view of an assembly of axial type electronic components.
Figure 11B:
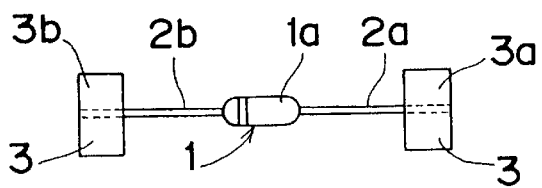
FIG. 11B is a structural view of an axial type electronic component.
Figure 12:
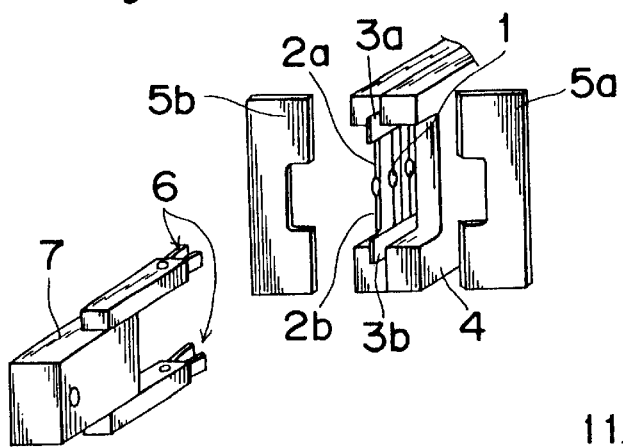
FIG. 12 is a perspective view of a component supplier of a prior art arrangement.
Figure 13:
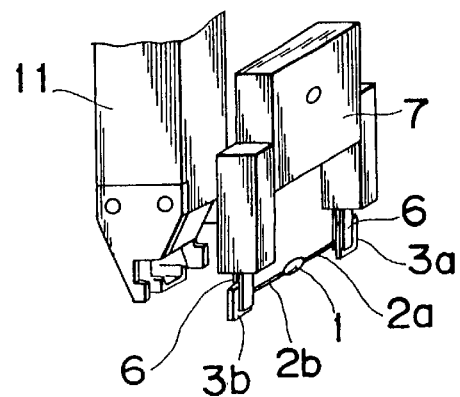
FIG. 13 is a schematic view of a component inserter of the prior art arrangement.

The axial type electronic component 1 that has been taken out is subjected to cutting of the tapes 3a and 3b by the cutters 5a and 5b as shown in FIGS. 5A and 5B (4th Step). By this cutting operation, the axial type electronic component 1 grasped by the chuck 6a is taken out in a state in which it is separated as shown in FIG. 11B from a state in which it is connected with the other components by the tapes 3a and 3b as shown in FIG. 11A.

Assuming that the tape interval is 26 mm in one case and the interval is 52 mm in another case, the manner in which electronic components are chucked in both cases will be explained below.

Figure 17:
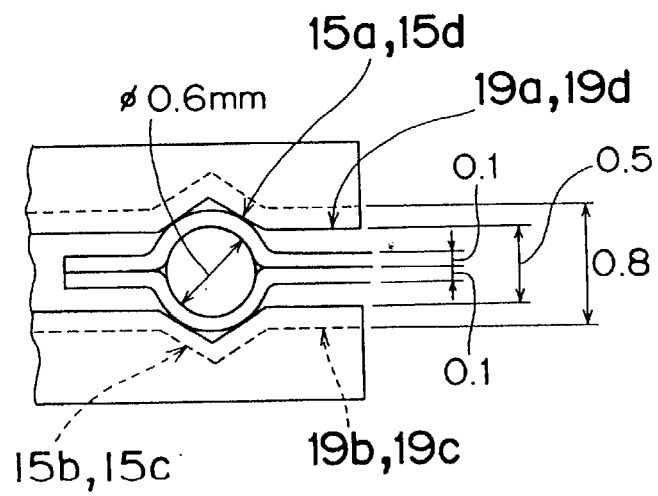
FIG. 17 is a view showing taped portions being grasped in a case where the tape interval is 52 mm.
Figure 18:
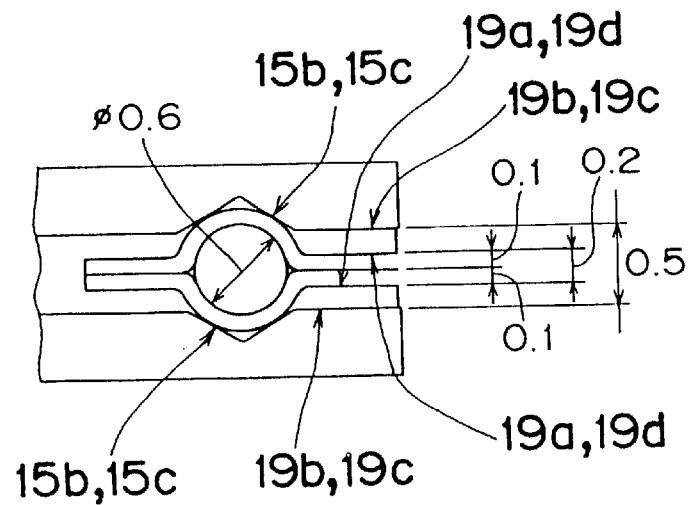
FIG. 18 is a view showing taped portions being grasped in a case where the tape interval is 26 mm.
Figure 19:
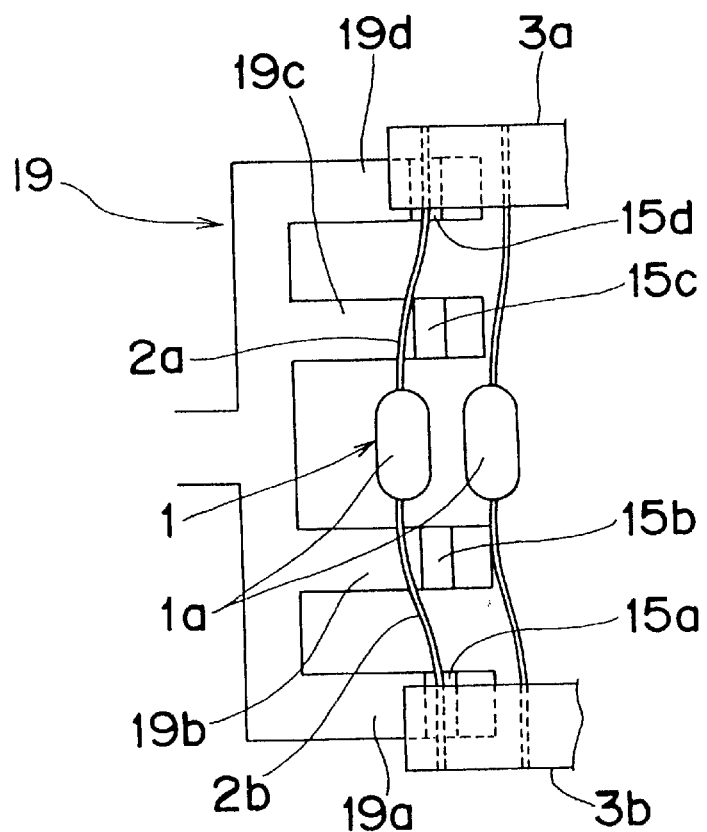
FIG. 19 is a view showing taped portions being grasped in a case where the tape interval is 52 mm.

When an electronic component 1 having a tape interval of 52 mm is to be chucked, the taped portions of the electronic component 1 are grasped by the outer-side pair of grasping grooves 15a, 15b. Assuming that the lead wire diameter of the electronic component 1 is 0.6 mm and the thickness of each paper of the tape is 0.1 mm, the clearance between the outer pair of protruding grasping pieces 19a and 19d is 0.5 mm and the clearance between the inner pair of protruding grasping pieces 19b and 19c is 0.8 mm, as shown in FIG. 17. In this case, as FIG. 19 shows, lead wires 2a, 2b bend as shown in FIG. 19 and, even where the lead wires 2a, 2b are likely to be dislocated from the inner-side grasping grooves 15b, 15c, the opposite taped portions of the electronic component 1 can be grasped by the outer side grasping grooves 15a, 15d with the lead wires 2 being not grasped by the projecting grasping pieces 19b and 19c, because the clearance between the inner side protruding grasping pieces 19b, 19c is larger than the diameter of the lead wires. If the inner side surfaces of the protruding grasping pieces 19a, 19b, 19c, 19d and groove positions of the grasping grooves 15a, 15b, 15c, 15d were all flush with one another, the lead wires would be grasped between the inner side protruding grasping pieces 19b, 19c and, therefore, taped portions of the electronic component 1 could not be grasped by the outer grasping grooves 15a, 15d. The detailed reason is as follows: The outer side protruding grasping pieces 19a, 19d and the inner side protruding grasping pieces 19b, 19c are integrally arranged on each chuck 16 and thus they are integrally moved to grasp the end portions of the electronic component or release the grasping. Therefore, when the outer side protruding grasping pieces 19a, 19d grasp the end portions of the electronic component, though unnecessary, the inner side protruding grasping pieces 19b, 19c do the similar grasping together with the outer side protruding grasping pieces 19a, 19d. Then, it is necessary to prevent the inner side protruding grasping pieces 19b, 19c from contacting the lead wires of the component grasped by the outer side protruding grasping pieces 19a, 19d as described above.

When an electronic component having a tape interval of 26 mm is to be chucked, the taped portions of the electronic component are grasped by the inner side grasping grooves 15b, 15c. Assuming that the lead wire diameter of the electronic component 1 is 0.6 mm and the thickness each paper of the tape is 0.1 mm in this case, the clearance between the outer pair of protruding grasping pieces 19a and 19d is 0.2 mm and the clearance between the inner pair of protruding grasping pieces 19b and 19c is 0.5 mm.

Meanwhile, in the component transferring station position Q, a component transferring process (process B) as shown in the 5th Step through the 7th Step is executed. That is, the chuck 6b has already undergone the 1st Step through the 4th Step (process A), and the chuck 6b has moved to the component transferring station position Q while grasping the axial type electronic component 1. Upon receiving a start command from the controller 18, the chuck 6b starts the operation of the component transferring process (process B) concurrently with the process A in a manner as follows.

That is, the chuck 6b advances in the lower direction as indicated by the arrow Y in FIG. 1 (5th Step) When the chuck 6b moves to the component transferring position, the axial type electronic component 1 grasped by the chuck 6b is delivered to the transferring device 12. The transferring device 12 catches the axial type electronic component 1 as shown in FIG. 7 by the transferring chucks 9a and 9b and the centering chucks 13a and 13b, so that the transferring device 12 receives the axial type electronic component 1 upon release of grasp and a retreating motion of the chuck 6b (6th Step)

The axial type electronic component 1 received by the transferring chucks 9a and 9b is subjected to centering position correction by the centering chucks 13a and 13b simultaneously with the release of grasp of the chuck 6b in a process C as follows (8th Step).

Figure 20A:
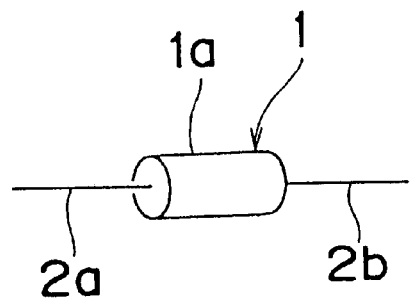
FIGS. 20A and 20B illustrate body configurations of electronic components.
Figure 20B:
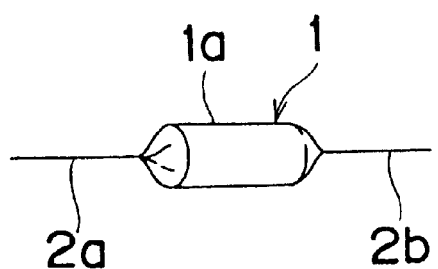
Figure 21:
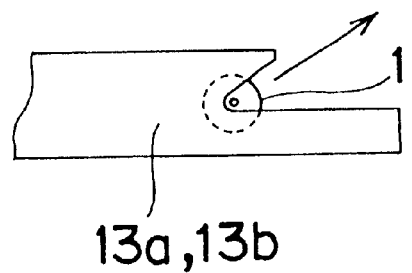
FIG. 21 is a view showing centering chucks in operation.

It is to be noted that the configuration of both ends of the body 1a of the electronic component 1 may vary in various ways as shown in FIGS. 20A and 20B. When the ends are of a planar configuration as in FIG. 20A, there is no problem, whereas if the ends are round as in FIG. 20B, the electronic component tends to become dislocated obliquely forward during a centering operation by the centering chucks 13a, 13b as shown in FIG. 21. In that case, however, ends of the electronic component 1 can be held in place by being guided by the recesses 30 of the centering chucks 13a, 13b. Therefore, the centering operation can be performed in a stable way.

Upon confirming the reception of the component 1 by the transferring device 12, the chuck 6b immediately retreats to return to its original position (7th Step).

Upon detecting the completion of the component transferring process (process B), the controller 18 outputs an operation command of a component transporting process (process C) as in the subsequent 8th through 10th Steps. That is, the centering operation as described above is performed in the 8th Step, and the transferring device 12 advances the axial type electronic component 1 in the lower-left direction of Z in FIG. 1 to an inserting position as indicated by K in FIG. 1 while holding the axial type electronic component 1 by the transferring chucks 9a and 9b and the centering chucks 13a and 13b (9th Step). Then, the axial type electronic component 1 is delivered to the inserting device 11 in the 10th Step.

Upon detecting the completion of the p10th Step of the component transporting process (process C), the controller 18 outputs an operation command of a component inserting process (process D) as indicated by the 12th Step through the 13th Step. That is, the inserting device 11 starts a component receiving process D for receiving the axial type electronic component 1 held by the transferring chucks 9a and 9b and the centering chucks 13a and 13b.

Upon the start of the process D, the transferring device 12 return to its original position (11th Step).

Further, upon detecting the completion of both the 4th Step of the component taking-out process (process A) and the 7th Step of the component transferring process (process B) concurrently with the above-mentioned process C and the process D, the controller 18 outputs an operation command of a carrier turning process (a state of process E). That is, a turn command of the controller 18 is outputted to the AC servomotor 8, so that the circular table 7 is turned by an angle of 90° in the direction as indicated by the arrow R in FIG. 1 (15th Step). By this operation, the chuck 6a in the component supplying station position P turns by an angle of 90° while grasping the axial type electronic component 1 and then stops in the component transferring station position Q. Meanwhile, the chuck 6b located in the component transferring station position Q turns by an angle of 90° in a similar manner and then stops in the next station. Meanwhile, the chuck 6c and the chuck 6d move to the respective subsequent station positions, so that the chuck 6d stops in the component supplying station position P.

Also, in the process D, the inserting device 11 cuts the lead wires 2a and 2b of the axial type electronic component 1 to a specified length as indicated by W in FIG. 8 concurrently with the aforementioned processes, and then bends the lead wires 2a and 2b to a specified width (12th Step). The thus processed axial type electronic component 1 is inserted into holes 17a and 17b of a board 17 as shown in FIG. 9 (13th Step). Subsequently, the inserted lead wires 2a and 2b of the axial type electronic component 1 are further bent on the rear surface of the board 17 so as to be fixed onto the board 17 (14th Step).

Thus, the work of the process B is executed concurrently with the process A in the state of the process F, and then the table 7 is turned in the state of the process E. Meanwhile, the work of the process C and the work of the process D are concurrently executed, so that one tact operation as described above is completed.

Even when the components are changed to axial type electronic components 1 having a varied tape interval of 52 mm, though the case is not shown in FIG. 1, such an axial type electronic component 1 having a varied specification can be easily inserted according to the above embodiment.

Furthermore, the aforementioned series of processes A through D as shown in FIG. 10 are satisfactorily timed by confirming the progress of each process based on signal conditions.

As described above, according to the aforementioned embodiment, the process E is executed after the process A and the process B are completed independently of the execution of the process C, thereby allowing the subsequent tact operation to be started. This arrangement means that the existence of the plurality of chucks 6a through 6d and the transferring device 12 enables the operations of the process A, process B ,and the process E independently of the operation of the process C, thereby efficiently supplying each component 1 to the inserting device 11. Therefore, the supply of each component 1 to the inserting device 11 can be smoothly performed successively without any extra wait time, and therefore the efficiency of insertion of the axial type electronic components 1 can be substantially improved.

The operations, for example, for confirming the reception of the component 1 by the transferring device 12 at the 7th Step, detecting the completion of the component transferring process (process B), detecting the completion of the 10th Step of the component transporting process (process C), detecting the completion of both the 4th Step of the component taking-out process (process A) and the 7th Step of the component transferring process (process B) concurrently with the above-mentioned process C and the process D can be performed by receiving signals outputted by sensors for detecting the respective operations.

The method of the embodiment of the present invention can operate as follows. That is, the process E in which the carrying device provided with the plurality of chucks moves and the process F in which the carrying device stops the chucks at least in the component supplying position and the component transferring position are alternately executed, the process A in which the chuck which stops in the component supplying position takes out an axial type electronic component from the component supplying device is executed within the process F, and the process B in which the axial type electronic component grasped through the process A is delivered to the component transferring device is executed concurrently with the above operation. Further, the process C in which the component transferring device delivers the axial type electronic component to the component inserting device through the process B is completed by a time when the chuck located in the component transferring position is put into a state in which the chuck becomes capable of delivering the axial type electronic component to the component transferring device in the process B of the next component inserting cycle. Then, the process D in which the axial type electronic component is fixed to the board through the process C is completed by a time when the component transferring device is put into a state in which the component transferring device becomes capable of delivering the axial type electronic component to the component inserting device in the process C of the next cycle. Therefore, the taking-out operation and the delivering operation of axial type electronic components can be simultaneously performed by different chucks. Furthermore, the process B is completed when the axial type electronic component is delivered to the component transferring device. Therefore, the operation of the component carrying device is enabled with completion of the process A with no wait for the inserting work of the component inserting device, so that the movement of unloaded chucks and the movement of the next component can be performed by means of the plurality of chucks. Therefore, the processing time can be substantially reduced, and the component inserting device can execute the process D by successively receiving axial type electronic components efficiently by the process C in which the axial type electronic components are transferred by the component transferring device.

In the case where the position of the axial type electronic component delivered to the component transferring device is centered by adjusting the main body of the component from both sides in the process B in which the axial type electronic component grasped by the chuck is delivered to the component transferring device, the center position of the component can be seized to allow centering correction to be surely achieved independently of the size of the main body of the component.

The apparatus of the embodiment of the present invention comprises: chucks constructed so that each of the chucks can move forward and backward while grasping the end portions of each axial type electronic component; a component carrying device which is provided with the chucks arranged at regular intervals in a circular form and each of the chucks operates intermittently by stopping the chucks at least in a component supplying position and a component transferring position; a component transferring device which receives each axial type electronic component from each chuck located in the component transferring position and carries the axial type electronic component to a component inserting position; and a component inserting device which receives the axial type electronic component from the component transferring device in the component inserting position and fixes the axial type electronic component to the board. With the above arrangement, the component supplying and transferring operations can be executed synchronously by the plurality of chucks which are arranged in a circular form and some of which stop at least in the component supplying position and the component transferring position upon the turning operation of the component carrying device. Furthermore, the existence of the component transferring device allows the intermittent turning operation of the component carrying device to be achieved efficiently, thereby producing the same effect as that, of the method of the embodiment of the present invention.

Furthermore, when each chuck serving as a component grasping device for grasping each axial type electronic component is provided with plural pairs of protruding grasping pieces corresponding to different tape intervals for concurrently grasping the tapes and lead wires of an axial type electronic component having a varied tape interval, the component transferring device is provided with retaining pieces corresponding to the protruding grasping pieces of the component. grasping device, and further the component transferring device is provided with centering pieces for centering the axial type electronic component by adjusting the main body of a set axial type electronic component from both sides, then axial type electronic components having different tape intervals can be easily transferred by the plural pairs of protruding grasping pieces and the retaining pieces corresponding to each taping interval. Furthermore, the centering pieces center the axial type electronic component by adjusting the main body of the axial type electronic component set in the transferring device from both sides. Therefore, the centering can be correctly achieved even when the main body of the electronic components varies in size or has a varied tape interval, thereby allowing components having different specifications to be inserted by simple mechanism at low cost.

Four chucks 6a through 6d are employed in the present embodiment. However, there may be employed any number of chucks so long as the number is not smaller than two and the chucks can position components 1 simultaneously in both the supplying device 4 and the inserting device 11. Furthermore, the supplying device 4 and the inserting device 11 are not required to be placed in adjacent station positions, and they may be placed in positions opposite to each other at an angle of 180°. Furthermore, the tape interval is limited neither to the interval of 26 mm nor to the interval of 52 mm, and the chuck 6 may be provided with two or more pairs of protruding pieces 19. Furthermore, the centering chucks 13a and 13b are operated according to the description of the operation of the aforementioned embodiment. However, they are not required to operate in the case of components which require no centering operation. In other words, the present invention is not limited to the aforementioned embodiment but accepts a variety of modifications based on the concept of the present invention, meaning that such modifications are not excluded from the scope of the present invention.

According to the present invention, there can be provided an axial type electronic component inserting method and apparatus capable of concurrently performing a plurality of processes through reduction of the wasteful blank time by means of the plurality of chucks and the transferring device so as to improve the efficiency of insertion of axial type electronic components, and easily managing axial type electronic components having different tape interval specifications by means of the plurality of grasping pieces provided at the chuck and the plurality of retaining pieces or the centering chucks provided at the transferring device.

Moreover, the present invention is such that, during a centering operation, both ends of the body of each axial type electronic component are guided into the recesses of the centering pieces so that the electronic component is prevented from being dislocated from the centering pieces due to the impact of centering. This ensures accurate centering of the component.

Furthermore, in the present invention, the grasping grooves of the outer-side protruding grasping pieces are slightly less deep than the grasping grooves of the inner-side protruding grasping pieces for grasping an electronic component whose tape portions are of a smaller interval. Therefore, when tape portions of an axial type electronic component which are relatively large are grasped by the chuck, the lead wire portions of the electronic component, with the end portions of the component held by the grasping grooves, are to be kept in free condition without being retained within the space between the grasping grooves for the electronic component of the smaller tape interval.

Therefore, even where the lead wire portions of an electronic component having a larger tape interval are so much bent as may be dislocated out of the grasping grooves for an electronic component having a smaller tape interval, the end portions of the electronic component can be positively retained without being grasped by the grasping pieces for grasping the component whose taped edges are of a smaller interval.

Although the present invention has been fully described in connection with the preferred embodiment thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. An electronic component inserting apparatus for use with an axial type electronic component having a body with opposite ends and lead wires projecting in opposite directions from the opposite ends, said electronic component inserting apparatus comprising:

a pair of centering chucks having lead wire holding parts constructed for holding the lead wires of the axial type electronic component while the lead wires of the axial type electronic component project in the opposite directions from the opposite ends of the axial type electronic component with the body of the axial type electronic component disposed between said centering chucks;

wherein said centering chucks have recesses formed therein at positions so as to face toward each other and, when the lead wires of the axial type electronic component are held by said lead wire holding parts of said centering chucks, so as to face the opposite ends of the axial type electronic component; and wherein said centering chucks are movable simultaneously toward each other in a symmetrical manner with respect to a center position between said centering chucks so as to cause, when the lead wires of the axial type electronic component are held by said lead wire holding parts of said centering chucks, one or both of said recesses of said centering chucks to engage one or both of the opposite ends of the axial type electronic component to thereby cause centering of the body of the axial type electronic component between said centering chucks.

2. An electronic component inserting apparatus as defined in claim 1, wherein said lead wire holding parts of said centering chucks comprise V-shaped notches respectively formed in said centering chucks.

3. An electronic component inserting apparatus as defined in claim 2, wherein said recesses are formed at vertexes of said V-shaped notches.

4. An electronic component inserting apparatus as defined in claim 3, wherein said V-shaped notches face in directions different from directions in which said recesses face.

5. An electronic component inserting apparatus as defined in claim 4, wherein said V-shaped notches both face in the same direction.

6. An electronic component inserting apparatus as defined in claim 2, wherein said V-shaped notches face in directions different from directions in which said recesses face.

7. An electronic component inserting apparatus as defined in claim 6, wherein said V-shaped notches both face in the same direction.

8. An electronic component inserting apparatus for use with an axial type electronic component having a body with opposite ends and lead wires projecting in opposite directions from the opposite ends, said electronic component inserting apparatus comprising a pair of centering chucks having lead wire holding notches formed therein for holding the lead wires of the axial type electronic component while the lead wires of the axial type electronic component project in the opposite directions from the opposite ends of the axial type electronic component with the body of the axial type electronic component disposed between said centering chucks;

wherein said centering chucks have recesses formed therein at positions so as to face toward each other and, when the lead wires of the axial type electronic component are held by said lead wire holding notches of said centering chucks, so as to face the opposite ends of the axial type electronic component; and wherein said centering chucks are movable simultaneously toward each other in a symmetrical manner with respect to a center position between said centering chucks so as to cause, when the lead wires of the axial type electronic component are held by said lead wire holding notches of said centering chucks, one or both of said recesses of said centering chucks to engage one or both of the opposite ends of the axial type electronic component to thereby cause centering of the body of the axial type electronic component between said centering chucks.

9. An electronic component inserting apparatus as defined in claim 8, wherein said notches face in directions different from directions in which said recesses face.

10. An electronic component inserting apparatus as defined in claim 9, wherein said notches both face in the same direction.

* * * * *